(12) United States Patent
Minzoni et al.

(10) Patent No.: US 7,728,648 B2
(45) Date of Patent: Jun. 1, 2010

(54) SEMICONDUCTOR DEVICE CHIP, SEMICONDUCTOR DEVICE SYSTEM, AND METHOD

(75) Inventors: Alessandro Minzoni, Xi'an Shaanxi (CN); Thilo Schaffroth, Roehrmoos (DE)

(73) Assignee: Qimonda AG, Munich (DE)

( * ) Notice: Subject to any disclaimer, the term of this patent is extended or adjusted under 35 U.S.C. 154(b) by 80 days.

(21) Appl. No.: 12/032,326

(22) Filed: Feb. 15, 2008

(65) Prior Publication Data

US 2008/0197915 A1 Aug. 21, 2008

(30) Foreign Application Priority Data

Feb. 15, 2007 (DE) .................. 10 2007 007 566

(51) Int. Cl.
*H03K 3/01* (2006.01)

(52) U.S. Cl. ...................................... 327/534; 327/565

(58) Field of Classification Search ................ 327/525, 327/534, 535, 536, 564, 565, 566
See application file for complete search history.

(56) References Cited

U.S. PATENT DOCUMENTS

| 6,388,312 | B2  |   | 5/2002  | Lee |
| 6,624,506 | B2  | * | 9/2003  | Sasaki et al. ................ 257/686 |
| 6,649,931 | B2  |   | 11/2003 | Honma et al. |
| 6,812,557 | B2  | * | 11/2004 | Matsuo et al. ............... 257/686 |
| 6,927,620 | B2  | * | 8/2005  | Senda ......................... 327/536 |
| 7,327,590 | B2  | * | 2/2008  | Matsui et al. ................ 365/51 |
| 7,521,950 | B2  | * | 4/2009  | Bernstein et al. ............ 324/763 |
| 2002/0191470 | A1 |   | 12/2002 | Ford et al. |

* cited by examiner

*Primary Examiner*—Jeffrey S Zweizig
(74) *Attorney, Agent, or Firm*—Dicke, Billig & Czaja, PLLC

(57) ABSTRACT

A semiconductor device chip, semiconductor device system, and a method. One embodiment provides a semiconductor device chip including a device for determining whether the semiconductor device chip is to be placed in a current saving operating mode.

11 Claims, 2 Drawing Sheets

SEMICONDUCTOR DEVICE CHIP, SEMICONDUCTOR DEVICE SYSTEM, AND METHOD

CROSS-REFERENCE TO RELATED APPLICATIONS

This Utility patent application claims priority to German Patent Application No. DE 10 2007 007 566.0 filed on Feb. 15, 2007, which is incorporated herein by reference.

BACKGROUND

The invention relates to a semiconductor device chip, to a semiconductor device system with a plurality of, in one embodiment stacked, semiconductor device chips, and to a method for operating a semiconductor device system.

Semiconductor devices, e.g., integrated (analog or digital) computing circuits, semiconductor memory devices such as, for instance, functional memory devices (PLAs, PALs, etc.) and table memory devices (e.g., ROMs or RAMs, in one embodiment SRAMs and DRAMs), etc. are subject to comprehensive tests during and after their manufacturing processes.

For the common manufacturing of a plurality of (in general identical) semiconductor devices, a wafer (i.e. a thin disc of monocrystalline silicon) is used. The wafer is processed appropriately (e.g., subject successively to a plurality of coating, exposure, etching, diffusion, and implantation processes, etc.), and subsequently e.g., sawn apart (or e.g., scratched, and broken), so that individual device chips are then available.

During the manufacturing of semiconductor devices (e.g., of DRAMS (Dynamic Random Access Memories or dynamic read-write memories)), in one embodiment DDR-DRAMs (Double Data Rate—DRAMs) the (semi-finished or finished) devices that are still available on the wafer may be subject to appropriate tests (e.g., "wafer tests").

One or a plurality of further tests may be performed, for instance, after the incorporation of the semiconductor devices or device chips in semiconductor device packages, and/or e.g., after the incorporation of the semiconductor device packages (along with the respectively included semiconductor devices or device chips) in electronic modules, e.g., memory modules (so-called "module tests").

As device packages, appropriate plug or surface-mountable packages, e.g., BGA (Ball Grid Array) packages, etc. may, for instance, be used.

During the incorporation of a device or device chip in a package, connections—pads provided at the semiconductor device are connected with connections—pins provided at the device package by using appropriate bonding wires.

In one single device package, instead of one single semiconductor device or device chip, in one embodiment DRAM chip, a plurality of, e.g., two (or e.g., four) devices, etc. may in one embodiment also be arranged. By the use of such a package with a plurality of chips ("multiple chip package") it is possible to increase the package density.

Part of the connections of a first device arranged in a respective multiple chip package and part of the connections of a second device arranged in a respective multiple chip package, etc. may be connected by using bonding wires with one and the same device package pins, and another part of the connections, in one embodiment, for instance, CS connections (chip select connections), etc., with pins, e.g., chip select pins, etc. that are separate for every device.

If, in the above-mentioned semiconductor device tests, it is determined that a chip that is incorporated in a multiple chip package is defective, but the multiple chip package includes at least one further faultless chip, one is anxious to nevertheless use the multiple chip package (e.g., a "dual die device" including two chips then as a "single die device" instead as a "dual die device" (or e.g., a "four fold stack device" including four chips then as a "dual die device" instead as a "four fold stack device" etc.)).

After the incorporation of the multiple chip package in an electronic module, e.g., memory module, the respective defective chip is controlled such by the applying of signals to pins of the multiple chip package that it consumes only relatively little power.

The remaining power consumption of the defective chip may nevertheless still be relatively high.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide a novel semiconductor device chip, a novel semiconductor device system, and a novel method for operating a semiconductor device system, by which overcome disadvantages of conventional device chips, systems, and/or methods.

In one embodiment, there is provided a semiconductor device chip including devices for determining whether the semiconductor device chip is to be placed in a deactivation or current saving operating mode, respectively.

In one embodiment, the chip may, for instance, include a one time programmable element, e.g., an e-fuse resistor, wherein the state of the one time programmable element is evaluated when determining whether the semiconductor device chip is to be placed in the current saving operating mode.

In the current saving operating mode, one or a plurality of receiver or driver/receiver devices, and/or one or a plurality of voltage generators, and/or one or a plurality of voltage pumps, etc. of the chips may be placed in a deactivated state, and/or one or a plurality of lines provided on the chip, and/or networks may be connected with ground potential, etc.

Thus, the power consumption of the chip in one embodiment, for instance, of a defective chip arranged in a multiple chip package may be reduced.

Figure 1:
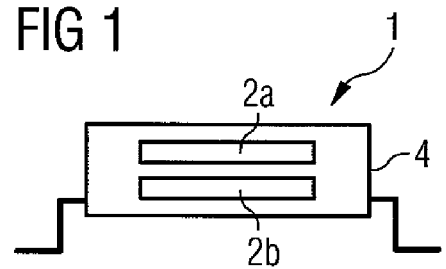
FIG. 1 illustrates a schematic representation of a system according to a first embodiment with a semiconductor device package into which two semiconductor device chips are incorporated.

FIG. 1 illustrates a schematic representation of a system 1 with two semiconductor device chip 2a, 2b in accordance with a first embodiment.

The semiconductor device chips 2a, 2b may basically be any integrated (analog or digital) computing circuits, semiconductor memory devices such as, for instance, functional memory devices (PLAs, PALs, etc.) and table memory devices (e.g., ROMs or RAMs), etc., in one embodiment SRAMs (Static Random Access Memories) or DRAMs (Dynamic Random Access Memories or dynamic read-write memories), in one embodiment DDR DRAMs (Double Data Rate DRAMs).

The two semiconductor device chip 2a, 2b may be of substantially identical structure.

For instance, DRAM device chips may be used as semiconductor device chips 2a, 2b, e.g., a 256 Mbit, 512 Mbit, 1 Gbit, 2 Gbit, or 4 Gbit DRAM device chip 2a, 2b.

As is illustrated schematically in FIG. 1, the two semiconductor device chips 2a, 2b are arranged in the same semiconductor device package 4 (here: a "dual die device" package).

In one embodiment, the two semiconductor device chips 2a, 2b may also be arranged in several different, separate semiconductor device packages.

The package 4 or the packages, respectively, may, for instance, be a plug-mountable semiconductor device package, e.g., a Dual In Line (DIL) package, a Pin Grid Array (PGA) package, etc., or a surface-mountable semiconductor device package (SMD package), e.g., Ball Grid Array (BGA) package, etc.

As results further from FIG. 1, the semiconductor device chips 2a, 2b may be mounted in the package 4 such that they are substantially positioned on top of each other or are stacked, respectively, or in one embodiment also in any other manner.

By the stacking of the semiconductor device chips 2a, 2b in the same package 4, the system 1 may, if the semiconductor device chips are not defective (see below), e.g., if two 256 Mbit memory devices 2a, 2b are used as semiconductor device chips 2a, 2b, altogether be used as a 512 Mbit memory device (or e.g., if two 512 Mbit memory devices are used, as a 1 Gbit memory device, if two 1 Gbit memory devices are used, as a 2 Gbit memory device, etc.).

During the incorporation of the semiconductor device chips 2a, 2b in the device package 4, connections pads provided at the semiconductor device chips 2a, 2b are connected with connections pins provided at the device package 4 by using appropriate bonding wires.

Part of the connections or pads of the first semiconductor device chip 2a, and part of the connections or pads of the second semiconductor device chip 2b may each be connected with one and the same device package pins ("shared pins") by using appropriate bonding wires.

A CAS (Column Address Strobe) pin of the device package 4 may, for instance, by using appropriate bonding wires, be connected both with a CAS pad of the first semiconductor device chip 2a and with a CAS pad of the second semiconductor device chip 2b.

In one embodiment, for instance, a RAS (Row Address Strobe) pin of the device package 4 may, by using appropriate bonding wires, be connected both with a RAS pad of the first semiconductor device chip 2a and with a RAS pad of the second semiconductor device chip 2b, and, for instance, address input and data input/output pins of the device package 4 by using appropriate bonding wires both with address input and data input/output pads of the first semiconductor device chip 2a and with address input and data input/output pads of the second semiconductor device chip 2b, etc.

A further part of the connections or pads of the first semiconductor device chip 2a may, by using appropriate bonding wires, be connected with separate pins ("non-shared pins") for the first semiconductor device chip, not, however, with pads of the second semiconductor device chip 2b.

In one embodiment, a further part of the connections or pads of the second semiconductor device chip 2b may, by using appropriate bonding wires, be connected with separate pins ("non-shared pins") for the second semiconductor device chip 2b, not, however, with pads of the first semiconductor device chip 2a.

For instance, a first CS (Chip Select) pin of the device package 4 may, by using an appropriate bonding wire, be connected with a CS (Chip Select) pad of the first semiconductor device chip 2a, not, however, with a CS (Chip Select) pad of the second semiconductor device chip 2b.

In one embodiment, for instance, a second CS (Chip Select) pin of the device package 4 may, by using an appropriate bonding wire, be connected with a CS (Chip Select) pad of the second semiconductor device chip 2b, not, however, with a CS (Chip Select) pad of the first semiconductor device chip 2a.

Furthermore, a first clock or clock enable or CKE pin of the device package 4 may, by using an appropriate bonding wire, be connected with a (CKE) pad of the first semiconductor device chip 2a, not, however, with a (CKE) pad of the second semiconductor device chip 2b, and a second clock or clock enable or CKE pin of the device package 4, by using an appropriate bonding wire, with a (CKE) pad of the second semiconductor device chip 2b, not, however, with a (CKE) pad of the first semiconductor device chip 2b, etc.

Figure 2:
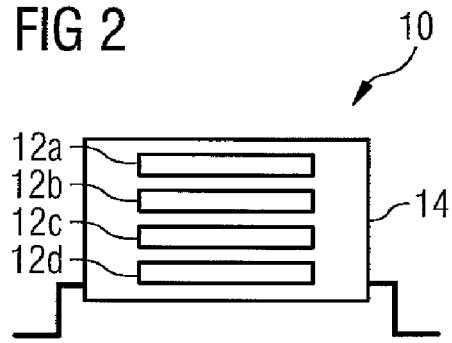
FIG. 2 illustrates a schematic representation of a system according to a second embodiment with a semiconductor device package into which four semiconductor device chips are incorporated.

FIG. 2 illustrates a schematic representation of a system 10 including more than two (here: four) semiconductor device chips 12a, 12b, 12c, 12d in accordance with an alternative, second embodiment.

The semiconductor device chips 12a, 12b, 12c, 12d may, correspondingly similar to the embodiment illustrated in FIG. 1, basically be any integrated (analog or digital) computing circuits, semiconductor memory devices such as functional memory devices (PLAs, PALs, etc.) and table memory devices (e.g., ROMs or RAMs), etc., in particular SRAMs (Static Random Access Memories) or DRAMs (Dynamic Random Access Memories or dynamic read-write memories), in particular DDR DRAMs (Double Data Rate DRAMs).

The four semiconductor device chips 12a, 12b, 12c, 12d may be of a substantially identical structure.

For instance, DRAM device chips may be used as semiconductor device chips 12a, 12b, 12c, 12d, e.g., 256 Mbit, 512 Mbit, 1 Gbit, 2 Gbit, or 4 Gbit DRAM device chips 12a, 12b, 12c, 12d.

As is illustrated schematically in FIG. 2, the semiconductor device chips 12a, 12b, 12c, 12d are arranged in the same semiconductor device package 14 (here: a "four fold stack device" package).

In further alternative variants, a different number of chips vis-à-vis the systems 1, illustrated in FIGS. 1 and 2 may also be provided in a device package, e.g., three, five, or eight chips, etc.

In one embodiment, the semiconductor device chips 12a, 12b, 12c, 12d illustrated in FIG. 2 may also be arranged in a plurality of different, separate semiconductor device packages.

The package 14 or the packages, respectively, may, for instance, be a plug-mountable semiconductor device package, or a surface-mountable semiconductor device package, etc.

As results further from FIG. 2, the semiconductor device chips 12a, 12b, 12c, 12d may be mounted such in the package 14 that they are substantially positioned on top of each other or are stacked, respectively, or in one embodiment also in any other manner.

By the stacking of the semiconductor device chips 12a, 12b, 12c, 12d in the same package 14, the system 10 may—if the semiconductor device chips are not defective (see below)—, e.g., if four 256 Mbit memory devices 12a, 12b, 12c, 12d are used as semiconductor device chips 12a, 12b, altogether be used as a 1 Gbit memory device (or e.g., if four 512 Mbit memory devices are used, as a 2 Gbit memory device, if four 1 Gbit memory devices are used, as a 4 Gbit memory device, etc.).

During the incorporation of the semiconductor device chips 12a, 12b, 12c, 12d in the device package 14, pads that are provided at the semiconductor device chips 12a, 12b, 12c, 12d are connected with pins that are provided at the device package 14 by using appropriate bonding wires.

Part of the connections or pads, respectively, of the first semiconductor device chip 12a (e.g., RAS and CAS pads, etc.), part of the connections or pads, respectively, of the second semiconductor device chip 12b, part of the connections or pads, respectively, of the third semiconductor device chip 12c, and part of the connections or pads, respectively, of the fourth semiconductor device chip 12d may, by using appropriate bonding wires, each be connected with one and the same device package pins (so-called "shared pins").

Another part of the connections or pads, respectively, of the first semiconductor device chip 12a (e.g., CS and CKE pads, etc.) may, by using appropriate bonding wires, be connected with separate pins ("non-shared pins") for the first semiconductor device chip of the device package 14, not, however, with pads of the second, third, and fourth semiconductor device chips 12b, 12c, 12d.

Correspondingly similar, another part of the connections or pads, respectively, of the second semiconductor device chip 12b may, by using appropriate bonding wires, be connected with separate pins ("non-shared pins") for the second semiconductor device chip of the device package 4, not, however, with pads of the first, third, and fourth semiconductor device chips 12a, 12c, 12d, etc.

If, in one embodiment during the testing of system 1, 10 illustrated in FIGS. 1 and 2, it is determined that (at least) one of the semiconductor device chips 2a, 2b, 12a, 12b, 12c, 12d that are incorporated in the package 4, 14 or the above-mentioned plurality of separate packages is defective, the defective semiconductor device chip(s) 2a, 2b, 12a, 12b, 12c, 12d is/are, in one embodiment by using one of the methods that are explained in more detail in the following, placed in a specific operating mode, in particular in a specific current saving operating mode, that will be explained in more detail in the following, in which the defective chip is deactivated in the manner explained in more detail in the following.

This may, for instance, take place even prior to the incorporation of the semiconductor device package 4, 14 or the separate packages in a electronic module, e.g., memory module, or, in one embodiment only after the incorporation of the semiconductor device package 4, 14 or of the separate packages in a electronic module, e.g., memory module (e.g., after the soldering of the semiconductor device package 4, 14 or of the packages, respectively, with a printed circuit board).

In the above-mentioned specific operating mode, as will result from the statements below, the power consumption of the defective semiconductor device chip 2a, 2b, 12a, 12b, 12c, 12d is relatively low.

The further non-defective semiconductor device chips present in the respective semiconductor device package or in the respective separate packages (e.g., one of the two chips 2a, 2b incorporated in the semiconductor device package 4, or e.g., one or two or three of the chips 12a, 12b, 12c, 12d incorporated in the semiconductor device package 14) may, after the incorporation of the semiconductor device package 4, 14 or the separate packages, respectively, in a electronic module, e.g., memory module (e.g., after the soldering of the semiconductor device package 4, 14 with a printed circuit board), be operated in a conventional normal operating mode.

The semiconductor device package 4 incorporated in the electronic module, and illustrated in FIG. 1, may then, for instance, be operated as a "single die device" instead as a "dual die device", and the semiconductor device package 14 incorporated in the electronic module, and illustrated in FIG. 2, as a "dual die device" instead as a "four fold stack device", etc.

In one embodiment, non-defective-chip 2a, 2b, 12a, 12b, 12c, 12d, like conventionally, after the incorporation of the device package 4, 14 in the module, for instance, after the input of an address, that is, for instance, input via the above-mentioned address input pins of the device package 4, 14, data that are, for instance, input via the above-mentioned data input/output pins of the device package 4, 14 may be stored.

These data may later again, for instance, via the above-mentioned data input/output pins of the device package 4, 14, be read out again under the above-mentioned address.

The selection of the non-defective—chip 2a, 2b, 12a, 12b, 12c, 12d among the plurality of chips provided in the respective device package 4, 14 for the writing or reading of data may, for instance, be performed by applying a CS (Chip Select) signal to the chip select pin of the device package 4, 14 which is assigned to the respectively selected chip 2a, 2b, 12a, 12b, 12c, 12d.

Figure 3:
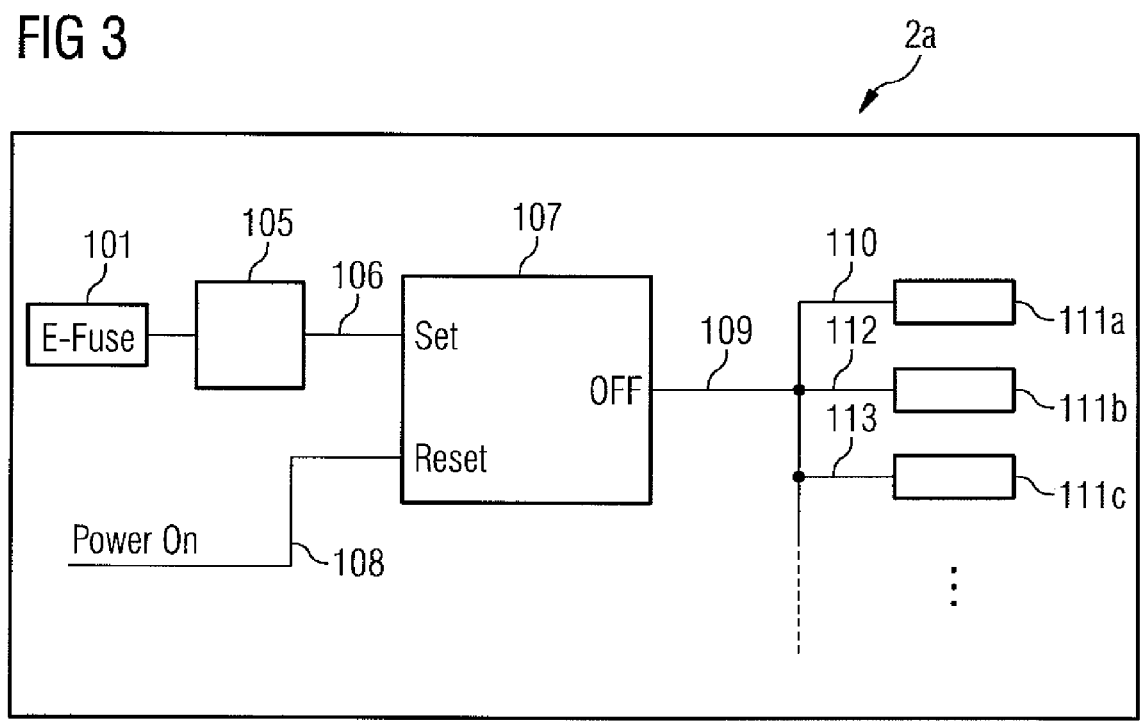
FIG. 3 illustrates a schematic detailed representation of a section of a semiconductor device chip illustrated in FIGS. 1 and 2 in accordance with a first variant of the embodiments.

To place a corresponding defective chip 2a, 2b, 12a, 12b, 12c, 12d in the above-mentioned specific (current saving) operating mode, as is illustrated in FIG. 3, a separate one time programmable element provided on the chip 2a, 2b, 12a, 12b, 12c, 12d, in particular a fuse element, e.g., a e-fuse resistor 101, may be used.

For instance, correspondingly similar as with conventional e-fuse resistors, the e-fuse resistor 101 may be fused or burnt through by using an appropriate electrical fuse method by applying a programming current pulse.

By that, the e-fuse resistor 101 is placed from a conductive, first state ("non-programmed state") in a non-conductive, second state ("programmed state").

The programming current pulse may, for instance, in reaction to a programming instruction signal applied to a control circuit, be automatically generated by the control circuit, and be applied to the e-fuse resistor 101.

The conductive, non-programmed state of the e-fuse resistor 101 may, for instance, correspond to a stored bit "0" (or "1"), and the non-conductive, programmed state of the e-fuse resistor 101, for instance, to a stored bit "1" (or "0").

The above-mentioned electrical fuse method may, for instance, be performed after the incorporation of the defective—chip 2a, 2b, 12a, 12b, 12c, 12d in the corresponding semiconductor device package 4, 14, but still prior to the incorporation of the device package 4, 14 in a corresponding electronic module, e.g., memory module, or, in one embodiment also only after the incorporation of the semiconductor device package 4, 14 (along with the defective chip) in the electronic module, e.g., memory module.

For triggering the programming of the e-fuse resistor 101, a specific pattern may be applied to the above-mentioned pins of the device package 4, 14, and by applying a CS (Chip Select) signal to the chip select pin assigned to the defective chip 2a, 2b, 12a, 12b, 12c, 12d, the defective chip 2a, 2b, 12a, 12b, 12c, 12d whose e-fuse resistor is to be programmed, may be selected.

The state of the e-fuse resistor 101 ("non-programmed state", or "programmed state" (or stored bit "0", or "1")) may, as is illustrated in FIG. 3, be evaluated by a evaluation circuit 105.

If the evaluation circuit 105 detects that the e-fuse resistor 101 is in the above-mentioned conductive, non-programmed state, the evaluation circuit 105 determines that the respective chip 2a, 2b, 12a, 12b, 12c, 12d is a non-defective chip 2a, 2b, 12a, 12b, 12c, 12d.

In this case, the evaluation circuit 105 does not output any (current saving) operating mode detection signal at a line 106, nor is any change of state of a signal present at the line 106 initiated, respectively.

The chip 2a, 2b, 12a, 12b, 12c, 12d then remains in the above-mentioned normal operating mode or can, as with conventional chips, be placed in the above-mentioned normal operating mode in a conventional manner.

If the chip 2a, 2b, 12a, 12b, 12c, 12d is, however, defective, the above-mentioned e-fuse resistor 101 is placed from the above-mentioned conductive, non-programmed state in the above-mentioned non-conductive, programmed state in the above-mentioned manner.

If the evaluation circuit 105 detects that the e-fuse resistor 101 is in the above-mentioned non-conductive, programmed state, the evaluation circuit 105 determines that the respective chip 2a, 2b, 12a, 12b, 12c, 12d is a defective chip 2a, 2b, 12a, 12b, 12c, 12d.

In this case, the evaluation circuit 105 outputs a (current saving) operating mode detection signal at the line 106, and/or a change of state of the signal present at the line 106 is initiated, respectively.

The chip 2a, 2b, 12a, 12b, 12c, 12d may then—in the manner that will be explained in more detail in the following—be placed in the above-mentioned specific (current saving) operating mode.

The evaluation of the state of the e-fuse resistor 101 may be performed at respectively predefined points in time or in respectively predefined intervals, e.g., during or after the starting or powering up of the system 1, 10 or of the electronic module, in particular memory module, to which the respective device package 4, 14 is connected, or during or after the beginning of the current supply to the chip 2a, 2b, 12a, 12b, 12c, 12d ("PowerOn"), etc.

For instance, as is illustrated in FIG. 3, the above-mentioned (current saving) operating mode detection signal output by the evaluation circuit 105 may be transmitted to a first input of a flip-flop 107, in particular the SET input thereof, via the above-mentioned line 106.

As is further illustrated in FIG. 3, a signal signaling the powering up or the starting of the powering up of the system 1, 10 or the presence or the beginning of the current or voltage supply, respectively, e.g., a PowerOn signal, may be applied to a second input of the flip-flop 107, in particular the RESET input thereof, via a further line 108.

If, during or after the powering up of the system 1, 10 or during or after the beginning of the current supply to the chip 2a, 2b, 12a, 12b, 12c, 12d ("PowerOn") the evaluation circuit 105 outputs a (current saving) operating mode detection signal at the line 106, or a change of state of the signal present at the line 106 is initiated, respectively, a (current saving) operating mode activation signal is output at the output of the flip-flop 107, i.e. at a line 109, and/or a change of state of the signal present at the line 109 is initiated, respectively.

The chip 2a, 2b, 12a, 12b, 12c, 12d is then placed in the above-mentioned specific (current saving) operating mode.

For instance, the above-mentioned (current saving) operating mode activation signal may, as is illustrated in FIG. 3, be transmitted, via the above-mentioned line 109 and one or a plurality of further lines 110, to some of or all the receiver or driver/receiver devices 111a provided on the respective chip 2a, 2b, 12a, 12b, 12c, 12d.

The receiver or driver/receiver devices 111a may be connected with respectively ones of the above-mentioned chip pads, e.g., the above-mentioned RAS, CAS, CKE, address input and data input/output pads, etc., and serve, for instance, to amplify or evaluate the signals received/to be transmitted at the respective pads, and/or to carry out level conversions, etc.

In one embodiment, the above-mentioned (current saving) operating mode activation signal may, via the above-mentioned line 109 and one or a plurality of further lines 112, be transmitted to some of or all the voltage generators 111b provided on the respective chip 2a, 2b, 12a, 12b, 12c, 12d.

The voltage generators may, for instance, be used to convert a (e.g., externally supplied) voltage to a voltage (used internally on the chip), in particular to a voltage with a lower level than the externally supplied voltage.

In one embodiment, the above-mentioned (current saving) operating mode activation signal may, via the above-mentioned line 109 and one or a plurality of further lines 113, be transmitted to some of or all the voltage pumps 111c provided on the respective chip 2a, 2b, 12a, 12b, 12c, 12d.

The voltage pumps may, for instance, be used to convert a voltage (that is, for instance, externally supplied or is used internally on the chip) to a higher-level voltage (used internally on the chip).

In reaction to the receipt of the above-mentioned (current saving) operating mode activation signal, the receiver or driver/receiver devices 111a receiving the signal, and/or voltage generators 111*b*, and/or voltage pumps 111*c* are deactivated, for instance, disconnected from the respectively voltage or current supply line supplying the respective (driver)/receiver devices or voltage generator or voltage pump.

For instance, in reaction to the (current saving) operating mode activation signal, all the receiver or driver/receiver devices, voltage generators, and voltage pumps provided on the respective chip 2*a*, 2*b*, 12*a*, 12*b*, 12*c*, 12*d* may be placed in a deactivated state, except those that are required for the maintenance of the (current saving) operating mode.

In one embodiment the above-mentioned deactivating of the receiver or driver/receiver device, voltage generators, and voltage pumps, in reaction to the (current saving) operating mode activation signal, one or a plurality of predetermined lines or networks provided on the respective chip 2*a*, 2*b*, 12*a*, 12*b*, 12*c*, 12*d* may be placed to ground potential or be connected with the ground potential (GROUND) by using appropriate switches, e.g., the bit line equalize voltage network, and/or the word line low voltage network, etc., or the lines carrying the voltages (bit line equalize voltage, word line low voltage, etc.), respectively.

In one embodiment, those networks/line may be placed to ground potential that are particularly susceptible to short circuits.

Instead by making use of the above-mentioned method, in one embodiment the above-mentioned e-fuse resistor 101, a defective chip 2*a*, 2*b*, 12*a*, 12*b*, 12*c*, 12*d* may be placed in the above-mentioned specific (current saving) operating mode in any other manner, or the above-mentioned (current saving) operating mode activation signal or a correspondingly similar signal on the respectively defective chip 2*a*, 2*b*, 12*a*, 12*b*, 12*c*, 12*d* may be generated in any other manner.

For instance, at a respectively predefined point in time or in a respectively predefined interval, e.g., during or after the starting or powering up of the system 1, 10 or of the electronic module, respectively, or during or after the beginning of the current supply to the chip 2*a*, 2*b*, 12*a*, 12*b*, 12*c*, 12*d* ("PowerOn"), an otherwise—in one embodiment in a normal operating mode—invalid signal might be applied to one or a plurality of the separate pins ("non-shared pins") of the device package 14 which are assigned to the—defective—chip 2*a*, 2*b*, 12*a*, 12*b*, 12*c*, 12*d* to be placed in the (current saving) operating mode, e.g., to the above-mentioned CKE and/or CS pin, etc.

For instance, at the CKE pin assigned to the respective—defective—chip 2*a*, 2*b*, 12*a*, 12*b*, 12*c*, 12*d* to be placed in the (current saving) operating mode, a "logic high" signal may be applied during "PowerOn".

Contrary to this, a "usual" powering up of the respective chip 2*a*, 2*b*, 12*a*, 12*b*, 12*c*, 12*d* (in one embodiment in the above-mentioned normal operating mode) requires the application of a "logic low" signal to the CKE pin until all voltages have been adjusted properly.

If the respective chip 2*a*, 2*b*, 12*a*, 12*b*, 12*c*, 12*d* detects that the signal present at the CKE pin assigned to the respective chip 2*a*, 2*b*, 12*a*, 12*b*, 12*c*, 12*d* is "logic high" instead of "logic low" during "PowerOn", the chip 2*a*, 2*b*, 12*a*, 12*b*, 12*c*, 12*d* is placed in the above-mentioned (current saving) operating mode, or the above-mentioned (current saving) operating mode activation signal or a correspondingly similar signal is generated on the chip 2*a*, 2*b*, 12*a*, 12*b*, 12*c*, 12*d*, respectively.

In reaction to this—as described above—the above-mentioned receiver or driver/receiver devices, voltage generators, and/or voltage pumps may be deactivated, and/or the above-mentioned lines or networks may be placed to ground potential or be connected with ground potential (GROUND), respectively, etc.

In one embodiment, a defective chip 2*a*, 2*b*, 12*a*, 12*b*, 12*c*, 12*d* may, for instance, also be placed in the above-mentioned specific (current saving) operating mode, or the above-mentioned (current saving) operating mode activation signal or a correspondingly similar signal may also be generated if a specific pattern, in one embodiment an initializing command, is applied to shared pins of the device package 14, i.e. to pins that are not assigned separately to any of the chips 2*a*, 2*b*, 12*a*, 12*b*, 12*c*, 12*d* mounted in the device package 4, 14 (i.e. the above-mentioned "shared pins"), e.g., to the above-mentioned CAS, and/or RAS pins, and/or to one or a plurality of further pins (e.g., a WE pin, etc.), and no CS (Chip Select) signal is assigned to the chip select pin of the device package 4, 14 which is assigned to the defective chip 2*a*, 2*b*, 12*a*, 12*b*, 12*c*, 12*d*.

To the chip select pin assigned to the remaining—non-defective—chips of the respective device package 4, 14, a CS (Chip Select) signal is applied, on the other hand.

Figure 4:
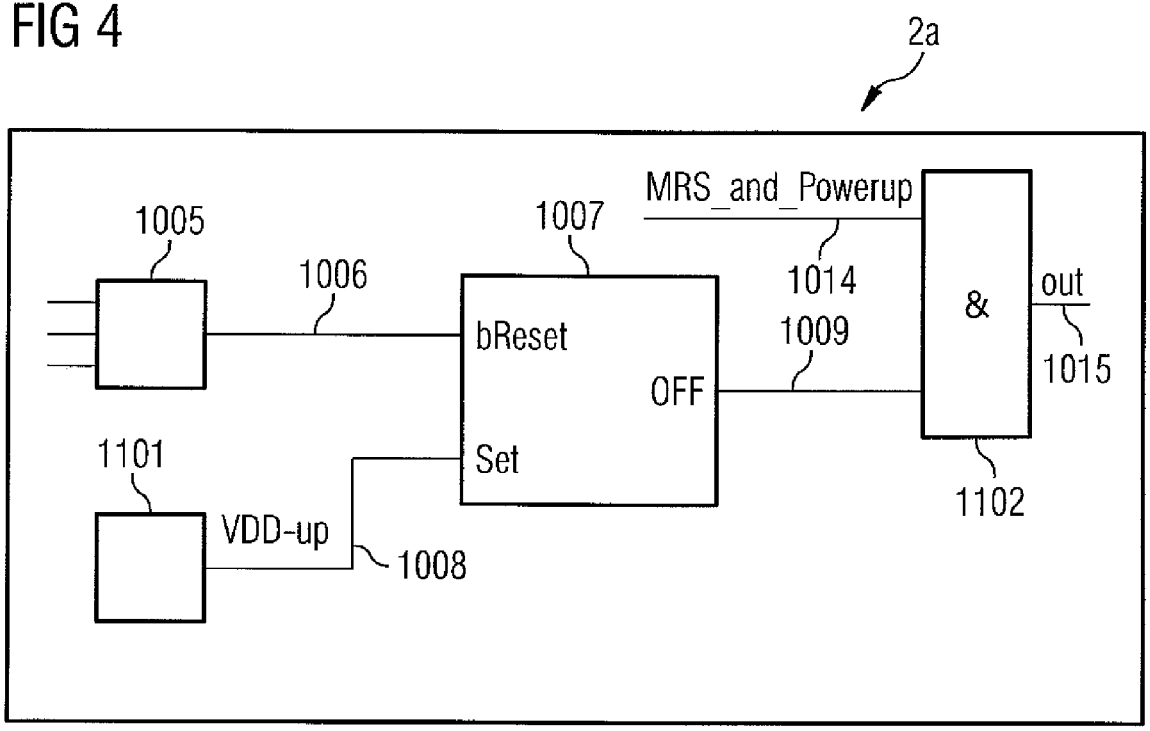
FIG. 4 a schematic detailed representation of a section of a semiconductor device chip illustrated in FIGS. 1 and 2 in accordance with a second, alternative variant of the embodiments.

If an evaluation circuit 1005 provided on the chips 2*a*, 2*b*, 12*a*, 12*b*, 12*c*, 12*d*—and illustrated, for instance, in FIG. 4—detects that the above-mentioned specific pattern is present at the above-mentioned shared pins of the device package 14—and thus also at the chip pads—, and that no CS (Chip Select) signal is present at the chip select pin of the device package 4, 14 which is assigned to the chip 2*a*, 2*b*, 12*a*, 12*b*, 12*c*, 12*d* (and thus also at the CS pad of the respective chip), the chip 2*a*, 2*b*, 12*a*, 12*b*, 12*c*, 12*d* may be placed in the above-mentioned (current saving) operating mode, and/or the above-mentioned (current saving) operating mode activation signal or a correspondingly similar signal may be generated.

If, on the other hand, the evaluation circuit 1005 provided on the chips 2*a*, 2*b*, 12*a*, 12*b*, 12*c*, 12*d* detects that the above-mentioned specific pattern is indeed present at the above-mentioned shared pins of the device package 14 (and thus also at the chip pads), but a CS (Chip Select) signal is additionally present at the chip select pin of the device package 4, 14 which is assigned to the chip 2*a*, 2*b*, 12*a*, 12*b*, 12*c*, 12*d*, the chip 2*a*, 2*b*, 12*a*, 12*b*, 12*c*, 12*d* is left in the above-mentioned normal operating mode or may—like with conventional chips—be placed in the above-mentioned normal operating mode in a conventional manner.

If a chip 2*a*, 2*b*, 12*a*, 12*b*, 12*c*, 12*d* is placed in the above-mentioned (current saving) operating mode, or if the above-mentioned (current saving) operating mode activation signal or a correspondingly similar signal is generated on the chip 2*a*, 2*b*, 12*a*, 12*b*, 12*c*, 12*d*—as described above—the above-mentioned receiver or driver/receiver devices, voltage generators, and/or voltage pumps of the respective chip 2*a*, 2*b*, 12*a*, 12*b*, 12*c*, 12*d* may be deactivated, and/or the above-mentioned lines or networks may be placed to ground potential or be connected with the ground potential (GROUND), respectively, etc.

In all of the above-mentioned methods, the above-mentioned (current saving) operating mode activation signal may also be generated with a predetermined additional time delay, or be switched on only after a predetermined—deliberately selected—(additional) time delay, or the transfer of the (current saving) operating mode activation signal may be performed in an additionally time-delayed manner, e.g., by resorting to one or a plurality of additional delay circuits connected in the signal path, etc.

Furthermore, in all of the above-mentioned methods, the change of a defective chip 2*a*, 2*b*, 12*a*, 12*b*, 12*c*, 12*d* in the above-mentioned specific (current saving) operating mode, and/or the generation of the above-mentioned (current saving) operating mode activation signal or of a correspondingly similar signal may be made dependent on a number of further conditions, e.g., on whether a detection devices, in one embodiment supply voltage power-up detection devices 1101, detected that an external voltage is present at the respective chip 2a, 2b, 12a, 12b, 12c, 12d or was powered up, e.g., an external supply voltage VDD, and/or on whether an internal voltage is present on the respective chip 2a, 2b, 12a, 12b, 12c, 12d (e.g., signaled by a signal MRS_and_Powerup present at a line 1014), etc.

For instance, as is illustrated in FIG. 4, the voltage supply power-up detection devices 1101, if it has detected that an external voltage is present at the respective chip 2a, 2b, 12a, 12b, 12c, 12d or was powered up, may output a corresponding supply voltage power-up signaling signal (VDD-up) via a line 1008 to a corresponding input of a flip-flop 1007, in one embodiment the SET input thereof.

Furthermore, as already indicated above, the evaluation circuit 1005 may output a (current saving) operating mode detection signal, or a change of state of a signal present at a line 1006 may be initiated, respectively, if the evaluation circuit 1005 has detected that the chip 2a, 2b, 12a, 12b, 12c, 12d is to be placed in the above-mentioned (current saving) operating mode.

The (current saving) operating mode detection signal may be supplied to a further input of the flip-flop 1007, in one embodiment the bRESET input thereof, via the line 1006.

In reaction to the signals present at the inputs of the flip-flop 1007, i.e. at the lines 1006 and 1008, a (current saving) operating mode activation signal may be output by the flip-flop 1007 at the output thereof, i.e. a line 1009, and be transferred to a first input of an AND gate 1102.

A second input of the AND gate 1102 is connected with the above-mentioned line 1014.

Only if the above-mentioned signal MRS_and_Powerup is present at the line 1014, i.e. the second input of the AND gate 1002, is the (current saving) operating mode activation signal present at the line 1009, i.e. at the first input of the AND gate 1102, transferred to the output of the AND gate 1002, i.e. a line 1015, and via this line, for instance, to the above-mentioned receiver or driver/receiver devices, voltage generators, and/or voltage pumps, etc. of the respective chip 2a, 2b, 12a, 12b, 12c, 12d which may be deactivated in reaction to the (current saving) operating mode activation signal as explained above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device chip comprising a device configured to determine whether the semiconductor device chip is to be placed in a deactivation or a current saving operating mode and including a onetime programmable element, wherein the device determines whether the semiconductor chip is to be placed in the current saving operating mode based on a state of the one-time programmable element, and wherein one or a plurality of receiver or driver/receiver using the chip are placed in a deactivated state in the current saving operating mode.

2. The semiconductor device chip of claim 1, comprising wherein the one time programmable element is a fuse element.

3. The semiconductor device chip of claim 1, comprising wherein the one time programmable element is an e-fuse resistor.

4. The semiconductor device chip of claim 1, comprising wherein the state of one or a plurality of signals present at one or a plurality of pads of the chip is evaluated during the determination of whether the semiconductor device chip is to be placed in the current saving operating mode.

5. The semiconductor device chip of claim 4, comprising wherein one or a plurality of the signal(s) is/are signals individually destined for the chip.

6. The semiconductor device chip of claim 5, comprising wherein it is determined that the chip is to be placed in the current saving operating mode if one or a plurality of the signal(s) is/are in a state invalid for a non-current saving operating mode.

7. The semiconductor device chip of claim 4, comprising wherein one or a plurality of the signal(s) is/are signals destined for one or a plurality of further chips in addition to the chip.

8. A semiconductor device chip comprising a device configured to determine, whether the semiconductor device chip is to be placed in a deactivation or a current saving operating mode and including a onetime programmable element wherein the device determines whether the semiconductor chip is to be placed in the current saving operating mode based on a state of the one-time programmable element and wherein one or a plurality of voltage generators of the chip are placed in a deactivated state in the current saving operating mode.

9. A semiconductor device chip comprising a device configured to determine whether the semiconductor device chip is to be placed in a deactivation or a current saving operating mode and including a onetime programmable element, wherein the device determines whether the semiconductor chi is to be laced in the current saving operating mode based on a state of the one-time programmable element, and wherein one or a plurality of voltage pumps of the chip are placed in a deactivated state in the current saving operating mode.

10. A semiconductor device chip comprising a device configured to determine whether the semiconductor device chip is to be placed in a deactivation or a current saving operating mode and including a one-time programmable element, wherein the device determines whether the semiconductor chip is to be placed in the current saving operating mode based on a state of the one-time programmable element, and wherein one or a plurality of lines or networks provided on the chip are connected with ground potential in the current saving operating mode.

11. A memory module comprising at least one semiconductor device chip according to claim 10.

* * * * *